(12) United States Patent
Riedesel et al.

(10) Patent No.: US 10,896,800 B2
(45) Date of Patent: Jan. 19, 2021

(54) CHARGED PARTICLE BEAM SYSTEM AND METHOD

(71) Applicant: Carl Zeiss MultiSEM GmbH, Oberkochen (DE)

(72) Inventors: Christoph Riedesel, Aalen (DE); Dirk Zeidler, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 0 days.

(21) Appl. No.: 16/530,077

(22) Filed: Aug. 2, 2019

(65) Prior Publication Data
US 2019/0355544 A1 Nov. 21, 2019

Related U.S. Application Data

(63) Continuation of application No. PCT/EP2018/056569, filed on Mar. 15, 2018.

(60) Provisional application No. 62/473,997, filed on Mar. 20, 2017.

(51) Int. Cl.
| | |
|---|---|
| *H01J 37/09* | (2006.01) |
| *H01J 37/10* | (2006.01) |
| *H01J 37/147* | (2006.01) |
| *H01J 37/22* | (2006.01) |
| *H01J 37/244* | (2006.01) |
| *H01J 37/28* | (2006.01) |

(52) U.S. Cl.
CPC .............. *H01J 37/09* (2013.01); *H01J 37/10* (2013.01); *H01J 37/147* (2013.01); *H01J 37/222* (2013.01); *H01J 37/244* (2013.01); *H01J 37/28* (2013.01); *H01J 2237/0044* (2013.01); *H01J 2237/1536* (2013.01)

(58) Field of Classification Search
CPC .......... H01J 37/09; H01J 37/10; H01J 37/147; H01J 37/222; H01J 37/244; H01J 37/28; H01J 2237/0044; H01J 2237/1536
USPC ................................. 250/306, 307, 310, 311
See application file for complete search history.

(56) References Cited

U.S. PATENT DOCUMENTS

| | | | |
|---|---|---|---|
| 9,336,982 B2 | 5/2016 | Zeidler et al. | |
| 2019/0355545 A1* | 11/2019 | Zeidler | H01J 37/28 |

FOREIGN PATENT DOCUMENTS

| | | |
|---|---|---|
| WO | WO 2005/024881 A2 | 3/2005 |
| WO | WO 2016/124648 A1 | 8/2016 |

OTHER PUBLICATIONS

International Search Report and Written Opinion for corresponding Appl No. PCT/EP2018/056569, dated Jul. 13, 2018.

* cited by examiner

*Primary Examiner* — Michael Maskell
(74) *Attorney, Agent, or Firm* — Fish & Richardson P.C.

(57) ABSTRACT

A charged particle beam system includes a charged particle source, a multi beam generator, an objective lens, a projection system, and a detector system. The projection system includes a first subcomponent configured to provide low frequency adjustments, and the projection system comprises a second subcomponent configured to provide a high frequency adjustments.

20 Claims, 5 Drawing Sheets

CHARGED PARTICLE BEAM SYSTEM AND METHOD

FIELD

The present disclosure relates to charged particle beam systems and methods. More particularly, the present disclosure relates to a multi beam charged particle beam system and related methods.

BACKGROUND

A multi beam charged particle beam system is disclosed, for example, in WO2005024881A2 and in WO2016/124648.

For multi beam charged particle beam systems, such as multi beam electron microscopes, interaction products, i.e. secondary electrons, originating from different primary charged particle beams are often imaged onto separate detectors by a projection system. To this end, electrostatic extraction fields can be used. A homogeneous extraction field helps the imaging of the interaction products, such as secondary electrons, onto individual detectors of a multi detector and that a mapping between scan deflector voltages and respective beam positions at the individual detectors of the multi detector is faithful. The spot shape of the secondary electrons at the individual detectors of the multi detector, for example a scintillator forming a component of the multi detector, depends on the homogeneity of the electrostatic extraction field. As one spot is imaged onto one or several corresponding detector(s), the homogeneity of the electrostatic extraction field governs the cross talk between beams and the corresponding detection signals.

In the presence of residual charges on the sample surface, the electrostatic extraction field can become distorted locally. Thereby, the imaging to separate detectors can become perturbed to an extent that a viable scan of the surface is not possible. Especially, the positioning of the beams at the detector can become strongly time-dependent and primary beam position dependent. Common methods for charge mitigation in scanning electron microscopes (SEM) are not straightforward to adapt to both the primary and secondary beam path of a multi beam scanning beam system, especially with respect to the extraction field homogeneity constraints for good secondary imaging. This applies to methods using a grid to reduce the effects of sample charging, gas injection approaches, and the like. Available methods to realign the detectors in steady-state cases (i.e. between workflow runs or between recording of image frames) are not fast enough to steer the beams in a multi beam charged particle beam system.

SUMMARY

The present disclosure seeks to provide a solution for operating a multi beam charged particle beam system also in cases in which the sample charges due to the impinging primary charged particle beams or beamlets.

In one aspect, the disclosure provides a charged particle beam system that includes a charged particle source configured to generate a first charged particle beam. The charged particle beam system also includes a multi beam generator configured to generate a plurality of charged particle beamlets from an incoming first charged particle beam. Each individual beamlet of the plurality of charged particle beamlets is spatially separated from other beamlets of the plurality of charged particle beamlets. The charged particle system further includes an objective lens configured to focus incoming charged particle beamlets in a first plane in a manner that a first region in which a first individual beamlet of the plurality of charged particle beamlets impinges in the first plane is spatially separated from a second region in which a second individual beamlet of the plurality of charged particle beamlets impinges in the first plane. In addition, the charged particle beam system includes a projection system, and the charged particle beam system includes a detector system including a plurality of individual detectors. The projection system is configured to image interaction products leaving the first region within the first plane due to impinging charged particles onto a first one of the plurality of individual detectors and to image interaction products leaving the second region in the first plane due to impinging charged particles onto a second one of the plurality of individual detectors. The projection system includes a first subcomponent providing low frequency adjustments and a second subcomponent providing a high frequency adjustments.

In another aspect, the disclosure provides a method of operating a charged particle beam system. The method includes aligning a multi beam charged particle beam system with static methods and static charged particle optical elements, with a fast multi beam projection alignment system in an off state. The method also includes rigging and starting a workflow. The method further includes activating a fast multi beam projection alignment system before a first image is recorded, and controlling the fast multi beam projection alignment system for an optimal imaging of interaction products onto a plurality of detectors.

In principle the disclosure involves dissecting the projection system into a static (or low frequency) subcomponent and a dynamic (or high frequency) subcomponent. With the high frequency subcomponent in situ realignment of the projection system is achieved.

The charged particle beam system includes a charged particle source configured to generate a first charged particle beam, and a multi beam generator configured to generate a plurality of charged particle beamlets from the incoming first charged particle beam, wherein each individual beamlet of the plurality of charged particle beamlets is spatially separated from all other beamlets of the plurality of charged particle beamlets. The charged particle beam system further includes an objective lens configured to focus incoming charged particle beamlets in a first plane in a manner that a first region in which a first individual beamlet of the plurality of charged particle beamlets impinges in the first plane is spatially separated from a second region in which a second individual beamlet of the plurality of charged particle beamlets impinges in the first plane. The charged particle beam system further includes a projection system and a detector system including a plurality of individual detectors. The projection system is configured to image interaction products leaving the first region within the first plane due to impinging charged particles onto a first one, or a first group, of the plurality of individual detectors and to image interaction products leaving the second region in the first plane due to impinging charged particles onto a second one, or a second group, of the plurality of individual detectors. The projection system includes a first subcomponent providing a low frequency adjustment and a second subcomponent providing a high frequency adjustments.

The first one detector of the plurality of individual detectors is different from the second one detector of the plurality of individual detectors. In cases in which a group of individual detectors is provided for each secondary charged particle beamlet, i.e. more than one detector for each secondary charged particle beamlet, the first group of individual detectors allocated to the first secondary charged particle beamlet is completely different from the second group of individual detectors allocated to the second secondary charged particle beamlet, no detector of the first group of individual detectors concurrently belongs to the second group of individual detectors.

In certain cases an individual detector can be composed of multiple sensitive detection-subfields, i.e. each secondary charged particle beamlet impinges on multiple detection subfields forming a single individual detector.

In an embodiment of the charged particle beam system the subcomponent providing high frequency adjustments includes at least one of the group including electrostatic lenses, electrostatic deflectors and electrostatic stigmators. Ideally the subcomponent providing high frequency adjustments only consists of electrostatic elements, such as electrostatic lenses, electrostatic deflectors and electrostatic stigmators, but does not include any magnetic elements.

The subcomponent providing high frequency adjustments can provide an adjustment frequency that is comparable to the scanning frequency with which the primary charged particle beamlets are scanned from one position on the sample surface to the next, i.e. the high frequency adjustments can be performed several times, i.e. more than once, while a scanning field on the sample is scanned with each primary charged particle beamlet.

The subcomponent providing high frequency adjustments also can include an electrostatic micro-lens array or an electrostatic stigmator array by which the individual secondary charged particle beamlets can be influenced individually. A respective electrostatic stigmator array can include a multi aperture array with an electron transmissive opening for each secondary electron beamlet and a number of two, three, four, six or eight electrodes surrounding each opening. The electrodes are electrically insulated with respect to each other and with respect to a carrier of the multi aperture array. By applying appropriate voltages to the individual electrodes surrounding each opening the secondary electron beamlet transmitting such opening can be adjusted or changed individually with high frequency.

In a further embodiment of the charged particle beam system the projection system includes a current monitoring aperture in a crossover plane.

In another embodiment, the charged particle beam system further includes a fast CCD camera. The fast CCD camera can be used to identify changes of the locations or form of the images (or spots) of the interaction products in a detection plane due to a charging of the sample. By analyzing images recorded with the fast CCD camera deviations of the spots or images of the interaction products in the detection plane from desired locations and/or from desired forms can be determined and appropriate adjustment values for the subcomponent providing high frequency adjustments can be deducted and respective adjustment voltages can be applied to the respective components.

In an embodiment, the charged particle beam system includes a computer system configured to analyze an actual state of the projection system and to manipulate the second subcomponent during scanning of a sample by the plurality of charged particle beamlets.

In a further embodiment of the charged particle beam system the computer system is configured to adjust the second (dynamic or high frequency) subcomponent of the projection system in a manner that positions and/or forms of the interaction products on the individual detectors of the multi detector are kept constant.

In an embodiment of the charged particle beam system the computer is configured to adjust the projection system in a two step mode, whereby,
  a. in a first step the first (low frequency) sub component is adjusted while the second (dynamic) subcomponent is kept constant or switched-off, and
  b. in a second step the second (dynamic) subcomponent is adjusted while the first subcomponent is kept constant.

A method according to an embodiment of the disclosure includes the steps:
  aligning a multi beam charged particle beam system with static methods and static charged particle optical elements, with a fast multi beam projection alignment method in an off state,
  rigging and starting a workflow,
  activating a fast multi beam projection alignment system before a first image is recorded, and
  controlling the fast multi beam projection alignment system for an optimal imaging of interaction products onto a plurality of detectors.

The alignment of the projection system by the aid of the dynamic subcomponent is carried out and repeated several times while the workflow of recording images of the sample is carried-out. The alignment of the projection system can be carried-out while an image of the sample is recorded by scanning the sample with the plurality of primary charged particle beamlets and recording interaction products caused to leave the sample because of the impinging primary charged particles, without any interruption of the process of recording images for the alignment of the projection system.

In a first step of the method, the multi beam charged particle beam system is adjusted by only using a static method and static (or low frequency) charged particle optical components. During this step no voltages or only known and predefined time-invariant voltages are applied to the component of the fast multi beam projection alignment system.

The fast projection system alignment to compensate for sample charging effects on detector collection efficiency and crosstalk provides a synchronization of the scan system of the multi beam charged particle beam system and a fast detector camera and real-time projection system alignment algorithms as well as a low latency control of the projection system alignment elements, e.g. focus.

The projection system includes a combination of a magnetic lens or several magnetic lenses with electrostatic elements. With the electrostatic elements hysteresis are eliminated and switching times of a few ms instead of seconds are achieved. In addition, a Larmor rotation during adjustment is avoided.

Electrostatic deflectors and/or electrostatic stigmators in the projective path of the interaction products provide the advantages of no eddy currents, no inductivity and adjustment times of μs instead of ms.

With a zoom aperture arranged within the projection system, such as described in FIG. 2 of WO2016/124648, a fast virtual change of an aperture size is achieved. Additional fast deflectors in the secondary charged particle beam path of the interaction products provide the possibility of a fast alignment of the beam paths onto the detection system.

With the aid of a fast angle-resolved current monitor arranged in a crossover plane of the beam paths of the interaction products a centering of the crossover in real-time can be achieved.

The fast CCD camera and electrostatic alignment elements can be directly coupled to the computer system. Thereby latencies through the main control software that controls all other elements are avoided and in an off-mode of the electrostatic alignment elements the secondary electron projection is not effected by them at all. The computer system can include a graphic processing unit (GPU) and can be FPGA assisted. The alignment algorithms can be configured for achieving a fast spot position and spot shape detection in the images recorded by the CCD camera. An optimal shift of the secondary electron beamlets can be achieved by using sensitivities of deflection elements to excitations of deflectors, and can use a feedback loop for a direct optimization. In the case of image distortion an excitation of stigmators can be used for adjusting optimal positions of the secondary electrons by using sensitivities of stigmators on the shape of the secondary electron beam spots and by using a feedback loop for direct optimization of the shape of the secondary electron beam spots.

With the alignment algorithms the excitation of stigmators are adjusted for an optimal spot shape by using sensitivities of stigmators and by using feedback loops for direct optimization. The alignment of focusing elements and sample high voltage bias is adjusted for optimal spot shape by using sensitivities of lenses, and also using feedback loops for direct optimization. For a crosstalk optimization a virtual aperture size can be changed via a projective crossover zoom system and the respective control algorithms for optimization of throughput (TPT) vs crosstalk in real time (once per frame).

The alignment algorithms can provide a fast switching from an image recording mode to a crossover monitoring mode, e.g. during flyback of the scanned primary charged particle beamlets, i.e. while, after a line or field on the sample has been scanned by the primary charged particle beamlets, the primary charged particle beamlets are moved back to the starting point of a new line or new frame; during such flyback normally no interaction products of the primary charged particle beamlets with the sample are used for recording an image of the sample. An optimization of the crossover position can also be achieved by a crossover monitoring in situ during the process of recording images of the sample by scanning the sample with the plurality of primary charged particle beamlets.

A fast angle-resolved current detection on an aperture is advantageous for centering and/or alignment of the crossover by adjusting the electrostatic elements to achieve a minimized current detected by an angle-resolved current detector. A respective angle resolved current detector can be achieved with a diaphragm in a crossover plane of the projection system having a plurality of electrically insulated electrodes surrounding the aperture opening.

An alternative embodiment of an angle resolved detector for beam centering can include an aperture covered with a scintillating material and a fast camera to detect the scintillation due to secondary charged particles impinging on the scintillating material. Also this alternative provides a crossover monitor for a real-time centering.

BRIEF DESCRIPTION OF THE DRAWINGS

More details will be disclosed with reference to the attached drawings, in which.

DESCRIPTION OF EXEMPLARY EMBODIMENTS

Figure 1:
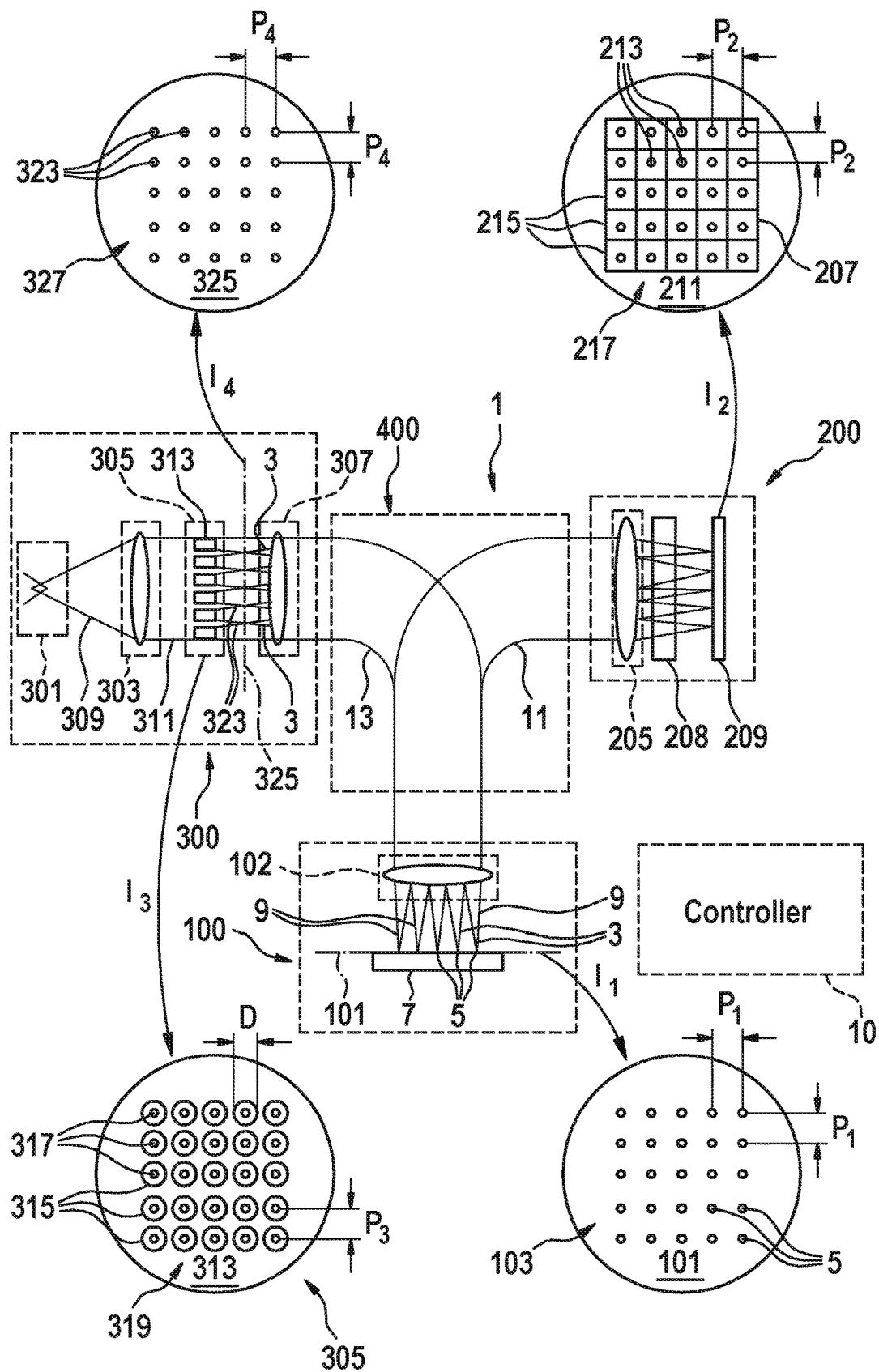
FIG. 1 illustrates an embodiment of a multi beam charged particle system.

In the exemplary embodiments described below, components similar in function and structure are indicated as far as possible by similar reference numerals.

The schematic representation of FIG. 1 illustrates basic features and functions of a multi-beamlet charged-particle microscopy system 1. It is to be noted that the symbols used in the Figure do not represent physical configurations of the illustrated components but have been chosen to symbolize their respective functionality. The type of system shown is that of a scanning electron microscope (SEM) using a plurality of primary electron beamlets 3 for generating primary electron beam spots 5 on a surface of an object 7 located in an object plane 101 of an objective lens 102. It goes however without saying that the features and functions of system 1 can also be implemented using instead of electrons other types of primary charged particles such as ions and in particular helium ions, positrons, muons, and others.

The microscopy system 1 shown includes a charged-particle multi-beamlet generator 300 for generating a plurality of primary charged-particle beamlets 3, a beam splitter unit 400 for separating the secondary charged-particle beam path 11 from the primary charged-particle beam path 13, an object irradiation unit 100 adapted to focus the primary charged-particle beamlets 3 onto the object plane 101, and a detection unit 200 for creating individual intensity signals for each of the secondary charged-particle beamlets 9.

In the embodiment illustrated, the primary beamlet generator 300 includes an electron source 301, a collimating lens 303, a primary beamlet-forming unit 305, and a field lens 307.

The electron source 301 generates a diverging electron beam 309 that is collimated by the collimating lens to form a beam 311 incident on the primary beamlet-forming unit 305. Instead of an electron source generating just one diverging electron beam 309 as shown in FIG. 1, an electron source creating two or more diverging electron beams may be used. The two or more electron beams are then collimated either by just one collimating lens 303 or by an appropriate number of collimating lenses 303, each collimating a subset or just one of the individual electron beams 309.

The beamlet-forming unit 305 basically includes a first multi-aperture plate illuminated by the one or more electron beams 311 and a second multi-aperture plate located, with respect to the direction of movement of the electrons in beam 311, downstream of the first multi-aperture plate. The second multi-aperture plate is preferably set to a defined potential so that a focussing quality is conferred to the apertures and the second multi-aperture plate takes on the function of a micro lens array.

The primary electrons incident on object 7 at a beam spot 5 generate secondary electrons emanating from the surface of the object 7. The secondary electrons form secondary electron beamlets 9, which traverse the objective lens 102 and the beam splitter unit 400 and follow the secondary beam path 11. The beam splitter unit 400 separates the secondary beam path 11 from the primary beam path 13 usually via magnetic fields and directs the secondary beam path 11 to a detection unit 200.

The detection unit 200 includes a projecting lens 205 for projecting the secondary electron beamlets 9 onto a surface plane 211 of an electron sensitive detector 207 of a detector arrangement 209. The electron sensitive detector 207 can be a single device or include more than one individual detectors. Irrespective of this, detector 207 provides an array of sensing areas arranged in a pattern compatible to the pattern of the secondary charged-particle beamlets 9 focussed by the projecting lens 205 onto the detector surface 211. This enables a detection of each individual secondary charged-particle beamlet 9 independent of the other secondary charged-particle beamlets 9 incident on the detector surface 211. Thus a plurality of electrical signals is created, whereby the value of each signal corresponds to the characteristics of just one of the secondary beamlets 9.

If the primary beamlet generator 300 allows not only to change the patterns of the primary beamlets 3 such that each pattern forms a sub-pattern of a basic pattern, but also to change the basic pattern, the detector arrangement 209 is preferably equipped with further detectors 207, each having its sensing areas arranged in a different basic pattern. Since the patterns of the secondary beamlets 9 correspond to the patterns of the primary beamlets 3 generated by the primary beamlet generator 300, the sensing area array pattern of each detector 207 preferably corresponds to one of the patterns available for the primary beamlets 3.

The object irradiation unit 100 includes an objective lens 102 focussing the primary charged-particle beamlets 3 onto the object plane 101 in which the investigated surface of an object 7 is positioned by an object mount like for example a sample stage. The object mount is not shown in the Figures. The object irradiation system 100 further includes a deflection system (not shown) by which the plurality of charged-particle beamlets can be deflected in a direction perpendicular to the direction of beam propagation in order to scan the surface of the sample concurrently with the plurality of focused charged particle beamlets.

In the illustrated example, the primary charged particle source is implemented in form of an electron source 301 featuring an emitter tip 310 and an extraction electrode 302. When using primary charged particles other than electrons, like for example helium ions, the configuration of the primary charged-particle source 301 may be different to that shown.

The electron source 301 emits a divergent electron beam 309, which is collimated in the shown example by collimating lens 303 to form a collimated beam 311. The collimating lens 303 is usually formed by one or more electrostatic or magnetic lenses, or by a combination of electrostatic and magnetic lenses. The use of a collimating lens is not imperative, but it is preferred when the multi-aperture plates used in the beamlet-forming unit 305 have a planar configuration, i.e. a configuration where the apertures 315 are arranged in a non-curved plane. When no collimating lens 303 is used, the apertures 315 of the multi-aperture plates 313 and 320 are preferably arranged in a curved plane which curvatures are adapted to the divergence of the primary beam 309 as e.g. described in document WO 2007/028596 A1, which is hereby incorporated by reference.

The collimated beam 311 (or the non-collimated beam, if no collimating lens is used) is incident on the multi-aperture selector plate 313 of the primary beamlet-forming unit 305. The multi-aperture plate selector 313 has two or more aperture arrays 317 formed therein. Each aperture array includes one or more apertures 315 formed in the multi aperture selector plate 313. The apertures of a multi-aperture array may be arranged in a one-dimensional or in a two-dimensional pattern, whereby two-dimensional patterns are preferred for a fast inspection of an object's surface.

The detection system further includes a filter 208 with the aid of which interaction products leaving the sample 7 in the first plane 101 (for example secondary electrons) can be filtered according to their trajectories or beam paths. An example of a respective detection system with a filter is shown in FIG. 2.

The multi beam system further includes a computer system or controller 10 which is configured to control the individual charged particle beam components as well as for evaluating and analyzing images recorded with multi detector 209. In addition the controller 10 is configured to generate images based on the detection signals gathered with multi detector 209 on a display.

Figure 2:
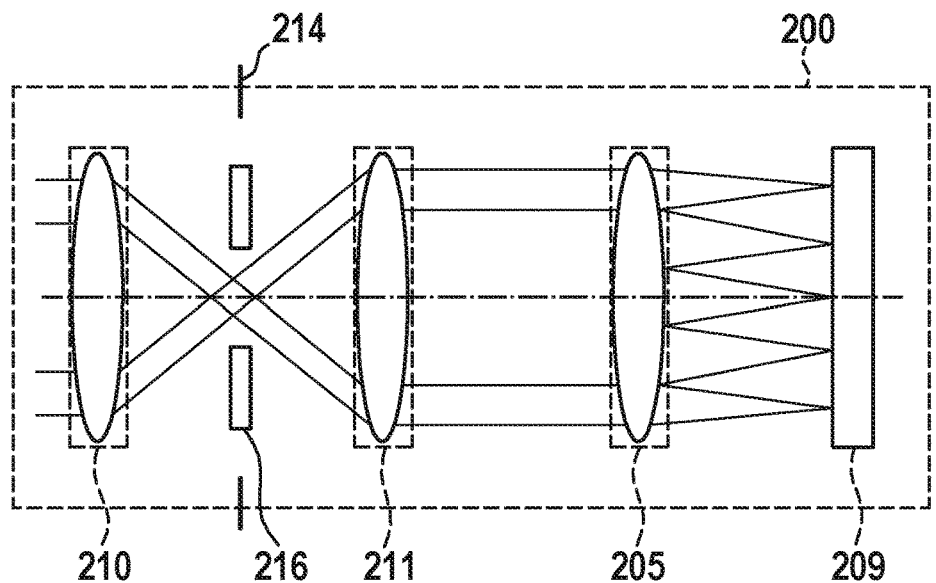
FIG. 2 illustrates a detection system of a first embodiment.

The detection system 200 in FIG. 2 includes in addition to the projection lens 205 and the multi detector 209 two additional charged particle lenses 210, 211. The first additional charged particle lens 210 forms a crossover in a crossover plane 214. In this crossover plane the beam paths of the interaction products which leave the first plane 101 in different regions, i.e. the beam paths of the secondary electron beamlets, are superimposed. The second additional charged particle lens 211 is operated so that its focal plane substantially coincides with the crossover plane 214 of the first additional charged particle lens 210. The beam paths of the interaction products leaving the first plane 101 then run separated from each other downstream of the second additional charged particle lens 211 and are projected by projection lens 205 onto separate detection regions 215 of the multi detector 209.

Figure 6:
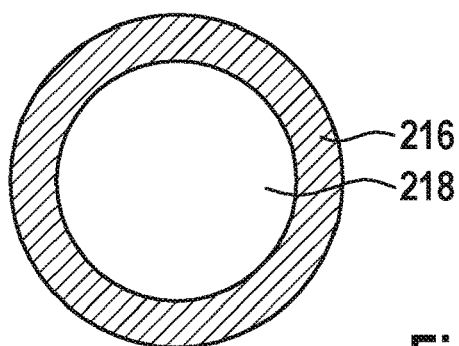
FIG. 6 illustrates a diaphragm which can be provided in the projection system to achieve a filtering of the secondary charged particle beamlets.

In the crossover plane 214 or in the neighborhood thereof a diaphragm 216 is arranged with the aid of which the interaction products can be filtered according to their beam paths. A first embodiment for a diaphragm is shown in FIG. 6 which includes a circular opening 218. The circular opening 218 is transmissive for interaction products while an outer portion of the diaphragm 216 is non-transmissive for the interaction products. With such kind of bright-field diaphragm in the crossover plane of the projection system a crosstalk between different individual detection fields, i.e. a crosstalk between the beam paths of interaction products leaving the first plane 101 in a first region and a detector assigned to interaction products leaving the first plane 101 in a second region different from the first region, can be avoided or at least reduced.

For a high frequency adjustment of the projection system in FIG. 2 additional dynamic elements such as electrostatic lenses, electrostatic deflectors and electrostatic stigmators can be provided in addition to the elements shown in FIG. 2 arranged in a similar manner and controlled in a similar manner as described with reference to FIG. 4 hereinafter.

Also the detector scheme for recording images of the spots generated by the secondary charged particle beamlets can be configured as described in more detail hereinafter with reference to FIG. 4.

Regarding further details of the system shown in FIG. 2 and the diaphragm shown in FIG. 6 reference is made to the description of the respective Figures in WO2016/124648 the disclosure of which with respect to the respective FIGS. 2 and 6 thereof is hereby incorporated by reference.

Figure 7:
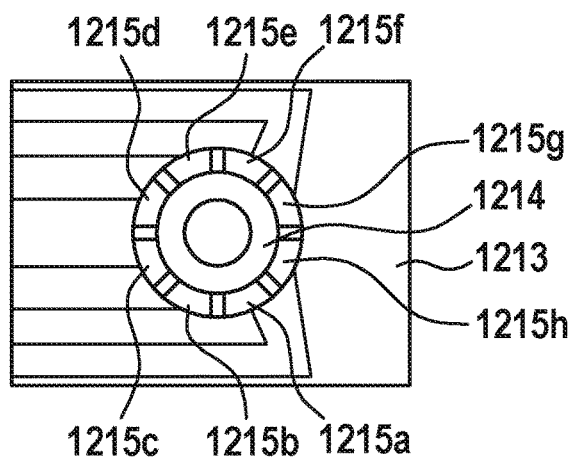
FIG. 7 illustrates an embodiment of a aperture diaphragm with cross-over monitoring capabilities for an angle dependent current readout for crossover position correction.

An alternative embodiment for a diaphragm in a detection system 200 is shown in FIG. 7. The diaphragm 1213 also has a circular opening 1214 which is transmissive for interaction products. However the circular opening is surrounded in a radial direction by a couple of electrodes 1215a to 1215h which are electrically insulated with respect to each other as well as with respect to the body of the diaphragm. The electrodes can serve as current detectors. Each electrode includes a signal line via which an electrical current induced within each electrode can be detected. By detecting asymmetries in the currents or charges induces in the set of electrodes 1215a to 1215h a decentering of the charged particle beamlets passing the aperture of the diaphragm can be detected.

In an alternative embodiment, instead of electrodes being arranged around the circular opening 1214 a scintillating material can be provided on the surroundings of the circular opening, and furthermore light detectors are provided to detect light emitted by the scintillating material due to impinging electrons. By detecting asymmetries in the light emission of the scintillating material a decentering of the charged particle beamlets passing the diaphragm 1213 can be detected.

Figure 8:
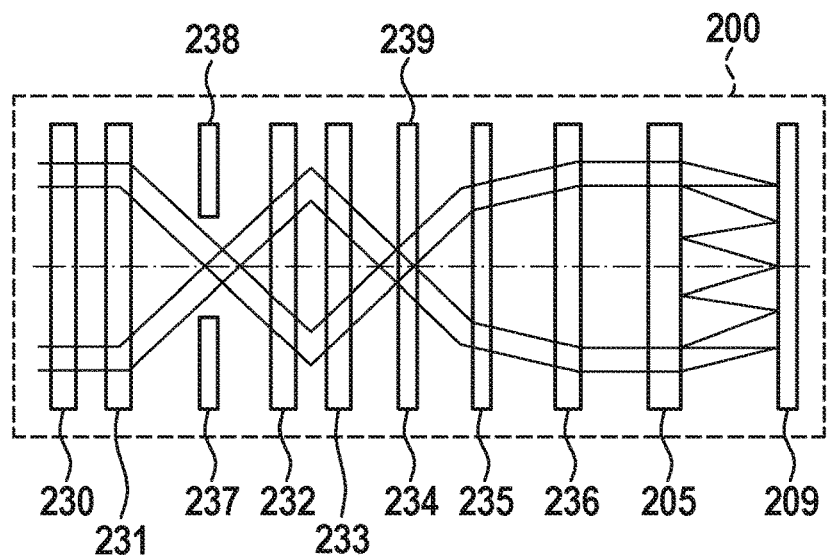
FIG. 8 illustrates a further embodiment of a detection system.

The diaphragm shown in FIG. 7 as well as the above described alternative embodiment for a diaphragm can be used as a in-situ crossover monitor if arranged in the crossover plane 214 of the detection system shown in FIG. 2 or the crossover plane 238 of FIG. 8. Accordingly, the projection system includes a current monitoring aperture in a crossover plane.

FIG. 8 shows an alternative of a detection system providing the possibility of filtering interaction products according to their beam paths. FIG. 8 is identical to FIG. 4 in WO2016/124648 and regarding a description of this detection system and its capabilities and advantages it is referred to the respective description of FIG. 4 in WO2016/124648, which is hereby incorporated by reference. It should especially be noted that the system shown in FIG. 8 (or FIG. 4 in WO2016/124648) forms a crossover-zoom system as this also is described in more detail in WO 2016/124648.

In addition to the projection lens 205 and the multi detector 209, the detector system 200 in FIG. 8 has six further particle beam lenses 230, 231, 232, 233, 235, 236. The two first further particle beam lenses 230, 231 form a first crossover of the secondary charged particle beamlets in a first crossover plane 238, the two subsequent further particle beam lenses 232, 233 form a second crossover of the secondary charged particle beamlets in a second crossover plane 239. The two further particle beam lenses 235, 236 following the second crossover plane 239 recollect the secondary charged particle beamlets of the interaction products emerging from the second crossover plane 239 in such a way that the interaction products emerging from the various field regions in the first plane 101 are again projected onto various detection regions 215 of the multi-detector 209 with the aid of the projection lens 205 on the multi-detector 209.

In this embodiment of the detector system 200, two different stops 237, 234 can be used simultaneously in the first and in the second crossover plane 238 and 239. By way of example, the bright field stop 213 depicted in FIG. 6 can be arranged in the first crossover plane 238 and the stop with a ring-shaped aperture can be arranged in the second crossover plane 239. The suppression of crosstalk between the detection regions 215 and the targeted filtering of the interaction products according to the start angle thereof in the first plane 101 is carried out simultaneously in this embodiment.

Here, attention is drawn to the fact that the two stops 237, 234 can also be arranged in an interchanged manner such that a stop with a ring-shaped aperture is arranged in the first crossover plane 238 and a stop with a central aperture is arranged in the second crossover plane 239.

By varying the excitations of the further particle beam lenses 230, 231, 232, 233, 234, 235, it is possible to set the trajectories of the secondary charged particle beamlets independently of one another in the two crossover planes 238, 239. By varying the trajectories in the crossover planes 238, 239, it is possible to simulate different stop radii and stop diameters, without stops needing to be mechanically interchanged therefore. The trajectories when entering into the detector system 200 and when entering into the projection lens 205 can be kept constant in this case such that the association between the field regions in the first plane 101 and the detection regions of the multi detector 209 can be maintained. The object field transmitted by all of the secondary charged particle beamlets in the first plane 101 remains unchanged and constant in the process.

In this case, the further particle beam lenses 230, 231, 232, 233, 235, 236 can be either magnetic lenses or electrostatic lenses.

In the embodiment of FIG. 8, the six further particle beam lenses 230, 231, 232, 233, 235, 236 form a projective system together with the two stops 234, 237 and the projection lens 205.

For a high frequency adjustment of the projection system in FIG. 8 again additional dynamic elements such as electrostatic lenses, electrostatic deflectors and electrostatic stigmators can be provided in addition to the elements shown in FIG. 8 arranged in a similar manner and controlled in a similar manner as described with reference to FIG. 4 hereinafter. Also the detector scheme for recording images of the spots generated by the secondary charged particle beamlets can be configured as described in more detail hereinafter with reference to FIG. 4.

Figure 3:
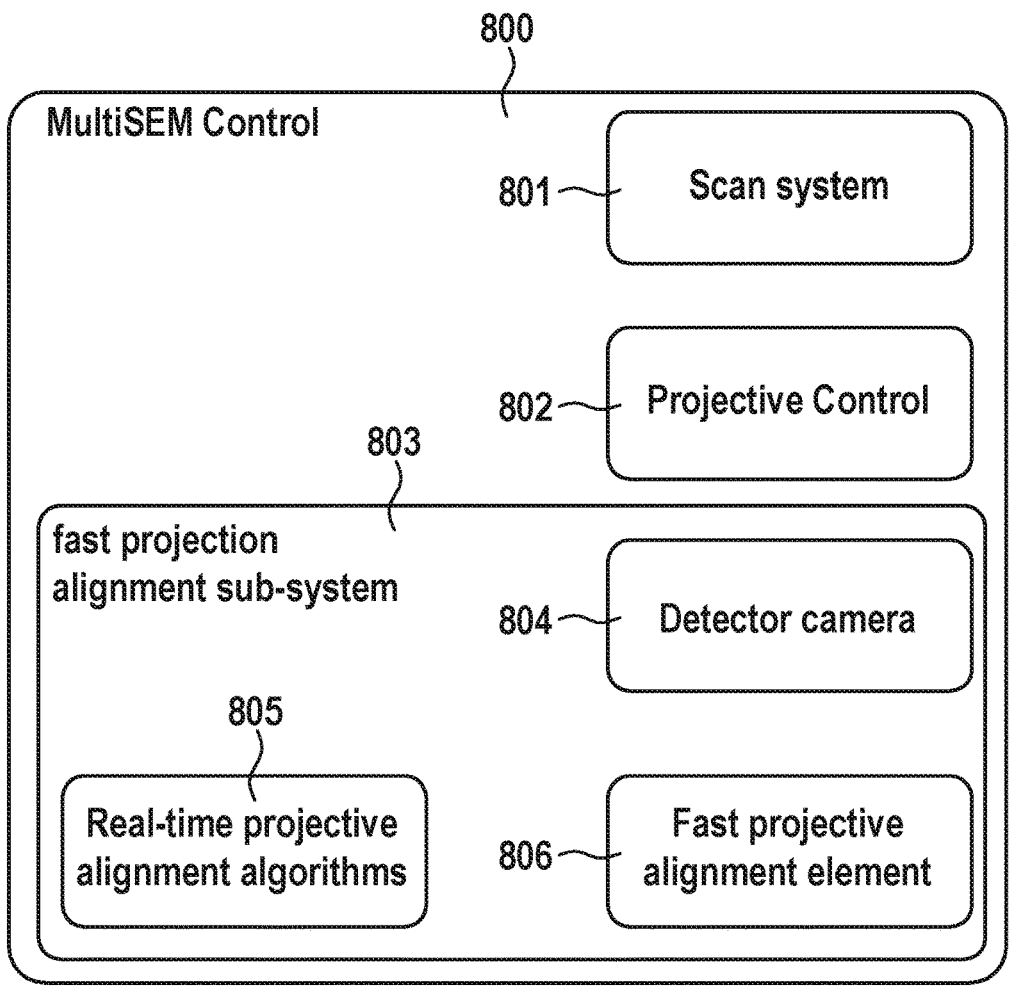
FIG. 3 is a block diagram of a portion of a multi beam projection control with a fast (dynamic) subcomponent for the projection system control in the beampaths of secondary electron beamlets.

FIG. 3 is a block diagram of a portion of the control system 800 (which corresponds to the control system 10 in FIG. 1) of the multi beam charged particle beam system. The control system 800 includes a scan system control component 801 and a control 802 for the static or low frequency subcomponents of the projection system for adjusting the charged particle beam lenses and multipoles. The control system 800 further includes a fast projection alignment sub-system including a detector camera 804 (corresponding to the spatially resolved detection system 290 in FIG. 4), real-time projective alignment algorithms 805 and one or more fast projective alignment element(s). The control system shown in FIG. 3 especially can be used for controlling, inter alia, a projection system as shown in FIG. 4 and described in more detail hereinafter.

Figure 4:
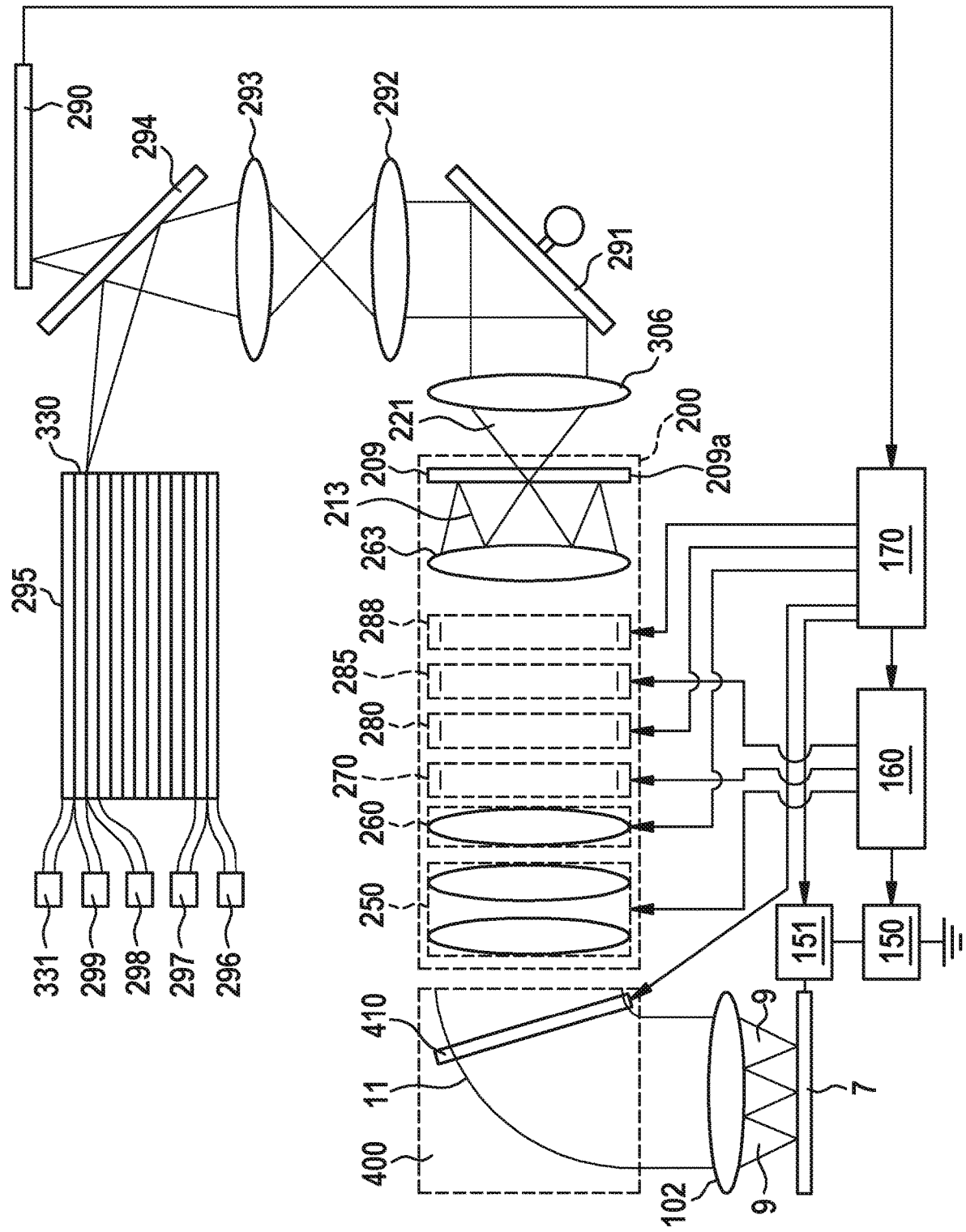
FIG. 4 illustrates a projection path with additional electrostatic deflectors, electrostatic stigmators, electrostatic lenses, a beam splitter deflector and a starting energy HV supply.

The projection system 200 in FIG. 4 includes a set of static (or low frequency) electron optical elements 250, 270, and 285, and a set of dynamic (or high frequency) electron optical elements 260, 280, and 288. The static electron optical elements are used for imaging of secondary electrons (SE) 3 from sample 7 onto the detection plane 209*a*. These can include one or more electron optical lenses 251, deflectors 271, and/or stigmators 286. As slow alignment times are sufficient in the static case, magnetic lenses, magnetic deflectors, and magnetic stigmators are used. A controller 160 controls the static electron optical elements 250, 270, and 285, as well as the static sample potential via a static voltage supply 150. To this end, the controller uses a spatially resolving detection system 290 that uses a fraction of the signal impinging onto the detection plane 209*a*. For example, a spatially resolved detection system 290 can include a fast CCD camera that images a fraction of the light emanating from spots from the detection plane 209*a*, where a plate made of a scintillating material placed onto a transparent carrier can be arranged to form a multi detector 209. Most of the signal produced in the detection plane 209*a* is used for feeding into the image acquisition system. The image acquisition system also forms part of the multi detector.

As described above, in the detection plane 209*a* a scintillator plate 209 is arranged onto which the secondary electron beamlets are directed by the projection system 200. The projection system 200 includes, when integrated in the multi-beam inspection system of FIG. 1, electron-optical components forming the electron beamlets 9, i.e., for example the objective lens 102 guiding the electron beamlets towards the multi electron-detector, the beam switch 400 and components focusing the electron beamlets 9 onto the surface of the scintillator plate 209 such as the lens 263. The electron beamlets 9 are incident onto the scintillator plate 209 at locations of incidence 213. Also if the electron beamlets 9 are focused onto the surface of the scintillator plate 209, beam spots are formed on the surface, the diameter of which cannot be arbitrarily small. The centers of the beam spots may be considered as the locations of incidence 213 disposed from each other at the distance P2 (see FIG. 1).

The scintillator plate 209 includes a scintillator material emitting light beams when excited by the incident electrons of the electron beamlets 9. Therefore, at each of the locations of incidence 213 a source of light beams is disposed. In FIG. 4, only a single such light beam 221 is shown emitted from the location of incidence 213 of one of the three depicted electron beamlets 9. The light beam 221 propagates through light optics including a first lens 306, a mirror 291, a second lens 292, a third lens 293 and a beam splitter 294 and is then incident onto a light receiving area 330 of the image acquisition system. The light receiving area 330 is formed by a front side of a bundle of glass fibers 295 into which a major portion of the light beam 221 is coupled and guided to light detectors 296, 297, 298, 299, 331. The light detectors may include, for example, photo multipliers, avalanche-photodiodes, photodiodes or other kinds of suitable light detectors. The light optics are configured so that it optically images the surface of the scintillator plate 209 arranged in the detection plane 209*a* into a region where the light receiving area 330 is disposed. Due to this optical imaging optical images of the locations of incidence 213 are formed in the light receiving area 330. For each of the locations of incidence 213 a separate light receiving area 330 of the image acquisition system is provided. Each of the further light receiving areas 330 can be formed by a front side of a light guide 295 guiding the light coupled into the front side to a separate respective light detector 296, 297, 298, 299, 331. Due to the optical imaging each of the locations of incidence 213 is associated with a light receiving area 330 wherein the light incident onto each of the light receiving areas 330 is detected by a separate one of the light detectors 296, 297, 298, 299, 331. The light detectors 296, 297, 298, 299, 331 output detection signals via electric signal lines. The detection signals represent intensities of the electron beamlets 9.

It should be mentioned that in FIG. 4, for simplification, only five light detectors 296, 297, 298, 299, 331 are shown. In a realistic embodiment the number of light detectors 296, 297, 298, 299, 331 corresponds at least to the number of primary charged particle beamlets and the number of secondary electron beamlets 9. In a preferred embodiment the image acquisition system includes even more light detectors 296, 297, 298, 299, 331 than the number of primary charged particle beams, for example five, ten or twenty light detectors for each secondary electron beamlet. A number of more than one light detector for each primary electron beamlet provides additional flexibility in assigning light detectors to a particular secondary charged particle beamlet.

A small portion of the light beam 221 transmits the beam splitter 294 and impinges onto the spatially resolving detection system 290 which can be a fast CCD camera.

In the embodiment elucidated herein, the light detectors 296, 297, 298, 299, 331 are disposed at a distance from the light receiving areas onto which the light optics (including the first lens 306, the mirror 291, the second lens 292, the third lens 293 and the beam splitter 294) image the scintillator plate 209 and the received light is guided to the light detectors by glass fibers. However, it is also possible that the light detectors 296, 297, 298, 299, 331 are directly disposed where the light optics generate the image of the scintillator plate 209 and the light sensitive areas are thus formed by the light receiving areas.

The secondary electron beamlets 9 propagate in a vacuum and also the surface of the scintillator plate 209 onto which the electron beamlets impinge is disposed in the vacuum. The light optics 306, 291, 292, 293, 294 may be disposed outside the vacuum wherein, then, a vacuum window is provided in the beam path of the light beam 221, the vacuum window being traversed by the beam 221 and separates the vacuum from the environment.

Detection of multiple beamlets of secondary charged particles can also be achieved with detection systems other than the combination of a scintillator, light optics, a fibre bundle and a light detector scheme as described above. It is also possible to use a combination of an MCP (Multi-Channel Plate) and a fast CCD camera with subsequent fast readout, or a direct electron detector where each secondary charged particle beamlet is imaged onto one or multiple pixels consisting of pn junctions that directly convert the incoming charged particles into an electric readout signal without intermediate conversion to photons and back. The adaption of the alignment schemes described below will be straightforward also for such alternative detection schemes.

The electron beams incident onto the scintillator plate 209 may ionize residual gas molecules in the region in front of the scintillator plate resulting in electric charges at the locations of incidence 213 and the charges may, in turn, attract residual gaseous contaminant in the vacuum so that the contaminant is deposited at the locations of incidence 213 on the scintillator plate 209 and result in the deterioration of the properties of the scintillator material so that the intensity of the light beams 221 caused by the incident electron beamlets 9 decreases over time. This problem can be coped with by displacing the locations of incidence 213 in a direction orthogonal to a surface normal of the scintillator plate 209, i.e. within the detection plane 209*a*. With this, the electron beamlets 9 are not always incident onto the surface of the scintillator plate at the same locations of incidence 213 but are moved over the surface of the scintillator plate 209 and, therefore, moved to ever new locations on its surface. A contamination occurring at distinct locations on the surface of the scintillator plate 209 then does not hinder the generating of light at the locations of incidence 213 caused by the incident secondary electron beamlets 9.

The dynamic electron optical elements are used for dynamically correcting residual imaging errors of secondary electrons (SE) 3 from sample 7 onto the detection plane 209*a* that are not accounted for by the static imaging system. These residual imaging errors can occur during the scanning of charging surfaces where the imaging properties and constraints, such as starting energy of the SE's or starting angle distribution of the SE's can change within one frame of imaging. These dynamic elements can include one or more electron optical lenses 260, deflectors 280, and stigmators 288. As fast alignment times are used in the dynamic case, only electrostatic components such as electrostatic lenses, electrostatic deflectors, and/or electrostatic stigmators are preferably used. A dynamic controller 170 controls the dynamic electron optical elements 260, 280, and 288, as well as the dynamic sample potential added to the static potential via voltage supply 151. To this end, the dynamic controller 170 uses the spatially resolving detection system 290 that uses a fraction of the signal impinging onto the detection plane 209*a*. The beam splitting device 400 consists of magnetic sectors that are statically aligned. A fast electrostatic deflection element 410 within the beam splitting device 400 is controlled as well by dynamic controller 170.

A further controller 160 controls the static or low frequency properties and components.

A final lens 263 for producing the spots on the detection plane 209*a* can be either of the static or dynamic type and controlled by controller 160 or 170, respectively.

Figure 5C:
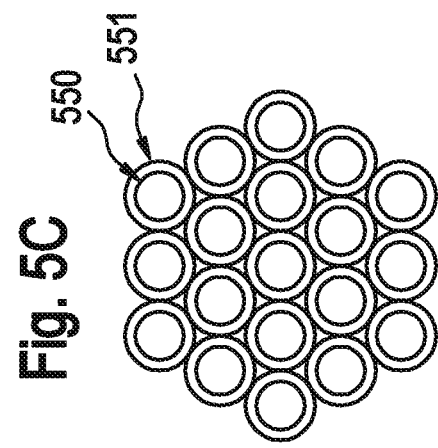
FIGS. 5A-5F illustrates corrections achieved with the dynamic subcomponent of the projection systems in cases of particular distortions caused by sample charging.
Figure 5F:
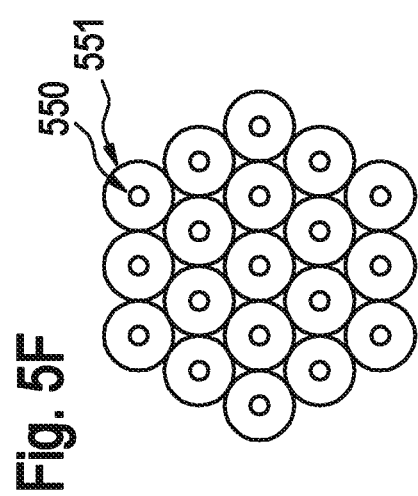
Figure 5B:
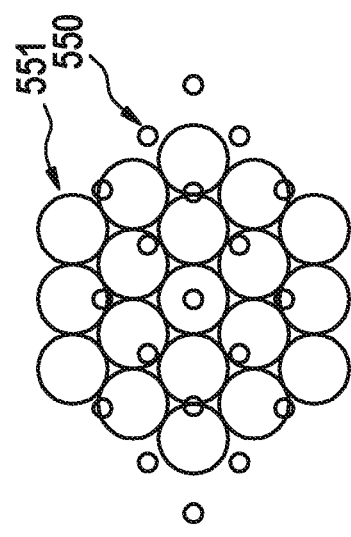
Figure 5E:
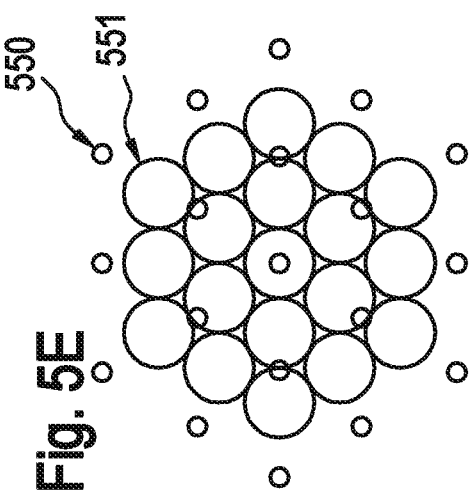
Figure 5A:
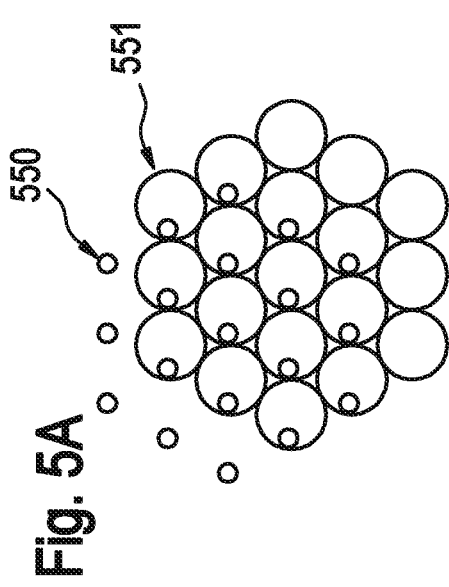

In FIGS. 5A to 5F circles 551 depict the areas on the spatially resolved detection system 290 that correspond to the sensitive areas of the corresponding detectors of the image acquisition system and, accordingly, to the ideal positions of the secondary electron beamlets in the detection plane 209. The mapping between these areas on spatially resolved detection system 290 and the sensitive areas of the image acquisition detectors is fix and can be calibrated upfront (for reference, see U.S. Pat. No. 9,336,982 B2 and references therein, which are hereby incorporated by reference). Circles 550 depict the position distribution of the secondary electron beamlets imaged by projection system 200 onto the detection plane 209*a*. FIG. 5A depicts a shift between the position distribution of the secondary electron beamlets 550 and the sensitive areas 551. Using fast deflection systems 280, this can be corrected to yield the correct positioning of the secondary electron beamlets 550 onto the sensitive areas 551 shown in FIG. 5F. To achieve this, the shift between the position distribution of the secondary electron beamlets 550 and the sensitive areas 551 is determined by recording and analyzing an image recorded by the spatially resolved detection system 290. Appropriate deflection potentials for the fast deflection system 280 are determined by the real-time projective alignment algorithms 805 by analyzing the recorded image, and the thus determined deflection potentials are applied to the fast deflection system 280 by dynamic controller 170. The deflection potentials are determined in a manner that with the appropriate potentials applied to the fast deflection system 280 the positions of the secondary electrons 550 coincide with the centers of the sensitive areas 551 as shown in FIG. 5F.

FIG. 5B depicts a distortion of the position distribution of the secondary electron beamlets 550 relative to the sensitive areas 551. Using fast stigmation systems 285, this can be corrected to yield the correct positioning of the secondary electron beamlets 550 onto the sensitive areas 551 shown in FIG. 5F. To achieve this, the distortion of the position distribution of the secondary electron beamlets 550 is determined by recording an image by the spatially resolved detection system 290, analyzing the image recorded by the spatially resolved detection system 290 by real-time projective alignment algorithms 805 and determining, based on the image analysis, appropriate stigmator voltages for the fast stigmation system 285. Keeping the spot stigmations correct at the same time involves the use of at least two stigmators, as described in great detail in US 20150357157 A1 which is hereby incorporated by reference. The stigmator voltages are determined by the real-time projective alignment algorithms 805 in a manner that with the appropriate voltages applied to the fast stigmation system 285 the positions of the secondary electron beamlets 550 coincide with the centers of the sensitive areas 551 as shown in FIG. 5F. The respectively determined stigmator voltages are applied to the fast stigmation system 285 by dynamic controller 170.

FIG. 5C depicts a defocus of the secondary electron beamlets 550 with respect to the sensitive areas 551. Using fast lens systems 260, this can be corrected to yield the correct focusing of the secondary electron beamlets 550 onto the sensitive areas 551 shown in FIG. 5F. To achieve this, the defocus of the secondary electron beamlets 550 at the sensitive areas 551 is determined by recording and analyzing, by real-time projective alignment algorithms 805, an image recorded by the spatially resolved detection system 290. Keeping the spot positions correct at the same time involves the use of at least two lenses, as described in great detail in US 20150357157 A1 which is hereby incorporated by reference. Appropriate voltages for the fast lens systems 260 are determined by the real-time projective alignment algorithms 805 and applied to the fast lens systems 260 by dynamic controller 170 in a manner that with the appropriate voltages applied to the fast lens systems 260 the positions of the secondary electron beamlets 550 coincide with the centers of the sensitive areas 551 and the diameters of the light spots on the spatially resolved detection system 290 are minimized or have the appropriate dimensions as shown in FIG. 5F.

Figure 5D:
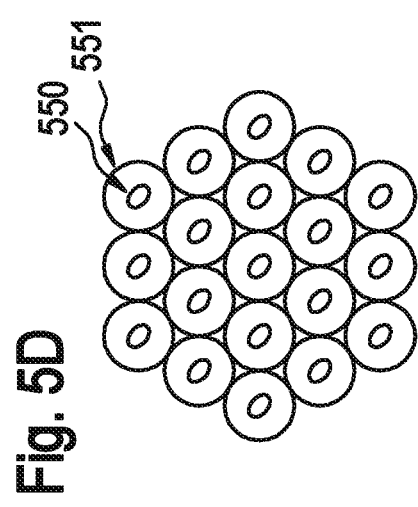

FIG. 5D depicts an astigmatic imaging of the secondary electron beamlets 550 onto the sensitive areas 551. Using fast stigmation systems 285, this can be corrected to yield the correct shape of the secondary electron beamlets 550 onto the sensitive areas 551 shown in FIG. 5F. Keeping the spot positions correct at the same time involves the use of at least two stigmators, as described in great detail in US 20150357157 A1 which is hereby incorporated by reference. To achieve stigmation, the astigmatic imaging of the secondary electron beamlets 550 is determined by recording and analyzing an image recorded by the spatially resolved detection system 290. Appropriate stigmator voltages for the fast stigmation system 285 are determined by the real-time projective alignment algorithms 805 and such stigmator voltages are applied to the fast stigmation system 285 by dynamic controller 170. The stigmator voltages are determined, based on the image analysis, in a manner that with the appropriate voltages applied to the fast stigmation system 285 the form of the beam spots of the secondary electron beamlets 550 become circular with their centers in the centers of the sensitive areas 551 as shown in FIG. 5F.

FIG. 5E depicts a magnification change in the imaging of the secondary electron beamlets 550 with respect to the sensitive areas 551. Using fast lens systems 260, this can be corrected to yield the correct positioning of the secondary electron beamlets 550 onto the sensitive areas 551 shown in FIG. 5F. Keeping the spot focusing correct at the same time involves the use of at least two lenses, as described in great detail in US 20150357157 A1 which is hereby incorporated by reference. To achieve this, the magnification change of the secondary electron beamlets 550 at the sensitive areas 551 is determined by recording and analyzing an image recorded by the spatially resolved detection system 290. Appropriate voltages for the fast lens systems 260 are determined by the real-time projective alignment algorithms 805, based on the image analysis, and applied to the fast lens systems 260 by dynamic controller 170. The appropriate voltages are determined by the real-time projective alignment algorithms 805 in a manner that with the appropriate voltages applied to the fast lens systems 260 the positions of all the secondary electron beamlets 550 coincide with the centers of the sensitive areas 551 and the diameters of the light spots on the spatially resolved detection system 290 are minimized or have the appropriate dimensions as shown in FIG. 5F.

Above, with respect to FIG. 5A to 5F only the correction of individual distortions is described. However, the real-time projective alignment algorithms 805 advantageously are configured also to determine appropriate potentials and voltages for the fast alignment components if the images recorded with the spatially resolved detection system 290 show combinations of the described distortions. Appropriate voltages for the electrostatic lenses, the electrostatic stigmators and the electrostatic deflectors then are determined by the real-time projective alignment algorithms 805 concurrently or sequentially in iterative steps.

The recording of the images with the spatially resolved detection system 290 takes place before an image of the sample is recorded by the aid of the multi detector or while portions of the image of the sample are recorded by the aid of the multi detector, for example after a predetermined number of lines has been scanned by the plurality of primary electron beamlets.

In the embodiment shown in FIG. 4 one or more elements 260, 280, 288 of the subcomponent providing high frequency adjustments also can include an electrostatic micro-optics array, such as an electrostatic micro-lens array, an electrostatic micro-deflector array or an electrostatic microsstigmator array by which the individual secondary electron beamlets can be influenced individually. A respective electrostatic micro-optics array can include a multi aperture array with an electron transmissive opening for each secondary electron beamlet and a number of one, two or more, i.e. for example three, four, six or eight, electrodes surrounding each opening. Multiple electrodes are electrically insulated with respect to each other and with respect to a carrier of the multi aperture array. By applying appropriate voltages to the individual electrodes surrounding each opening the secondary electron beamlet transmitting such opening can be adjusted or changed individually with high frequency.

What is claimed is:

1. A method, comprising:
a) aligning a multi beam charged particle beam system using static methods and static charged particle optical elements of the multi beam charged particle beam system;
b) rigging and starting a workflow; and
c) activating a fast multi beam projection alignment system of the multi beam charged particle beam system before a first image is recorded, and
d) controlling the fast multi beam projection alignment system for an optimal imaging of interaction products onto a plurality of detectors,
wherein, during a), the fast multi beam projection alignment system is in an off state.

2. The method of claim 1, further comprising recording images of patterns of a plurality of secondary charged particle beamlets.

3. The method of claim 2, further comprising:
analyzing the recorded images;
deducting appropriate voltages to correct deviations of the recorded patterns from desired patterns; and
applying the deducted voltages to appropriate components of the fast multi beam projection alignment system.

4. The method of claim 3, further comprising monitoring a centering of the plurality of secondary charged particle beamlets in a crossover plane.

5. The method of claim 4, further comprising adjusting the fast multi beam projection alignment system at least two times while simultaneously scanning a sample by a plurality of primary charged particle beamlets.

6. The method of claim 3, further comprising adjusting the fast multi beam projection alignment system at least two times while simultaneously scanning a sample by a plurality of primary charged particle beamlets.

7. The method of claim 2, further comprising adjusting the fast multi beam projection alignment system at least two times while simultaneously scanning a sample by a plurality of primary charged particle beamlets.

8. The method of claim 2, further comprising monitoring a centering of the plurality of secondary charged particle beamlets in a crossover plane.

9. The method of claim 1, further comprising adjusting the fast multi beam projection alignment system at least two times while simultaneously scanning a sample by a plurality of primary charged particle beamlets.

10. The method of claim 1, wherein the charged particle beam system comprises:
a charged particle source configured to generate a first charged particle beam;
a multi beam generator configured to generate a plurality of charged particle beamlets from an incoming first charged particle beam such that each individual beamlet of the plurality of charged particle beamlets is spatially separated from other beamlets of the plurality of charged particle beamlets;
an objective lens configured to focus incoming charged particle beamlets in a first plane so that a first region in which a first individual beamlet of the plurality of charged particle beamlets impinges in the first plane is spatially separated from a second region in which a second individual beamlet of the plurality of charged particle beamlets impinges in the first plane;
a projection system; and
a detector system comprising the plurality of individual detectors,
wherein:
the projection system is configured to image interaction products leaving the first region within the first plane due to impinging charged particles onto a first one of the plurality of individual detectors;
the projection system is configured to image interaction products leaving the second region in the first plane due to impinging charged particles onto a second one of the plurality of individual detectors;

the projection system comprises a first subcomponent configured to provide low frequency adjustments; and the projection system comprises a second subcomponent configured to provide a high frequency adjustments.

11. The method of claim 10, wherein the second subcomponent comprises at least one member selected from the group consisting of an electrostatic lens, an electrostatic deflector, and an electrostatic stigmator.

12. The method of claim 11, wherein the projection system comprises a current monitoring aperture in a cross-over plane.

13. The method of claim 12, wherein the charged particle system further comprises a fast CCD camera.

14. The method of claim 13, wherein the charged particle system further comprises one or more processing devices and one or more machine-readable hardware storage devices comprising instructions that are executable by the one or more processing devices to perform operations comprising:

analyzing an actual state of the projection system; and manipulating the second subcomponent during scanning of a sample by the plurality of charged particle beamlets.

15. The method of claim 14, wherein the operations further comprise adjusting the second subcomponent in a manner that positions and/or forms of beam spots of the interaction products on the individual detectors are kept constant.

16. The method of claim 15, wherein the operations further comprise adjusting the projection system in a two-step mode, wherein:

in a first step the first component is adjusted while the second subcomponent is kept constant or switched-off; and in a second step the second subcomponent is adjusted while the first subcomponent is kept constant.

17. The method of claim 10, wherein the projection system comprises a current monitoring aperture in a cross-over plane.

18. The method of claim 10, wherein the charged particle system further comprises a fast CCD camera.

19. The method of claim 10, wherein the charged particle system further comprises one or more processing devices and one or more machine-readable hardware storage devices comprising instructions that are executable by the one or more processing devices to perform operations comprising:

analyzing an actual state of the projection system; and manipulating the second subcomponent during scanning of a sample by the plurality of charged particle beamlets.

20. The method of claim 10, wherein the second subcomponent comprises an electrostatic micro-optics array.

* * * * *